United States Patent [19]

Yagi et al.

[11] Patent Number: 4,627,760
[45] Date of Patent: Dec. 9, 1986

[54] PLATE HOLDER

[75] Inventors: Masaru Yagi, Tsushima; Nobuaki Fujimoto, Okazaki; Yoshitoki Hayashi, Aichi, all of Japan

[73] Assignees: Kitagawa Industries Co., Ltd., Nagoya, Japan

[21] Appl. No.: 751,212

[22] Filed: Jul. 2, 1985

[30] Foreign Application Priority Data

Jul. 24, 1984 [JP] Japan .............................. 59-112236[U]

[51] Int. Cl.⁴ ................................................ F16B 9/02
[52] U.S. Cl. .................................. 403/201; 403/405.1; 403/187; 403/230; 403/194; 174/138 D; 24/297
[58] Field of Search ............... 403/405, 406, 187, 201, 403/245, 230, 194, 195, 196, 197; 24/297, 453, 573, 336, 326, 305; 411/349; 174/138 D; 361/403, 415; 220/22.3; 229/15

[56] References Cited

U.S. PATENT DOCUMENTS

| 3,542,980 | 11/1970 | Hamilton | 403/197 X |
| 3,837,136 | 9/1974 | Graham et al. | 403/405.1 X |
| 4,188,003 | 2/1980 | Ramsey | 403/195 X |
| 4,354,566 | 10/1982 | Yuda | 403/405.1 X |
| 4,444,321 | 4/1984 | Carlstrom | 248/239 X |
| 4,495,380 | 1/1985 | Ryan et al. | 174/138 D |

FOREIGN PATENT DOCUMENTS 1390653 1/1965 France .................................. 24/297

Primary Examiner—Cornelius J. Husar
Assistant Examiner—Joseph A. Fischetti
Attorney, Agent, or Firm—Oblon, Fisher, Spivak, McClelland & Maier

[57] ABSTRACT

A plate holder adapted to be connected in a mounting hole formed in a mounting plate, in which two holding plates are erected on a base perpendicularly in spaced relation to each other, and outside the holding plates are provided elastic non-return pieces adapted to be elastically retained in the mounting hole of the mounting plate. Such construction permits the plate holder to be used even where there is not much space below a plate to be held, used also as a guide rail and facilitates inspection.

4 Claims, 8 Drawing Figures

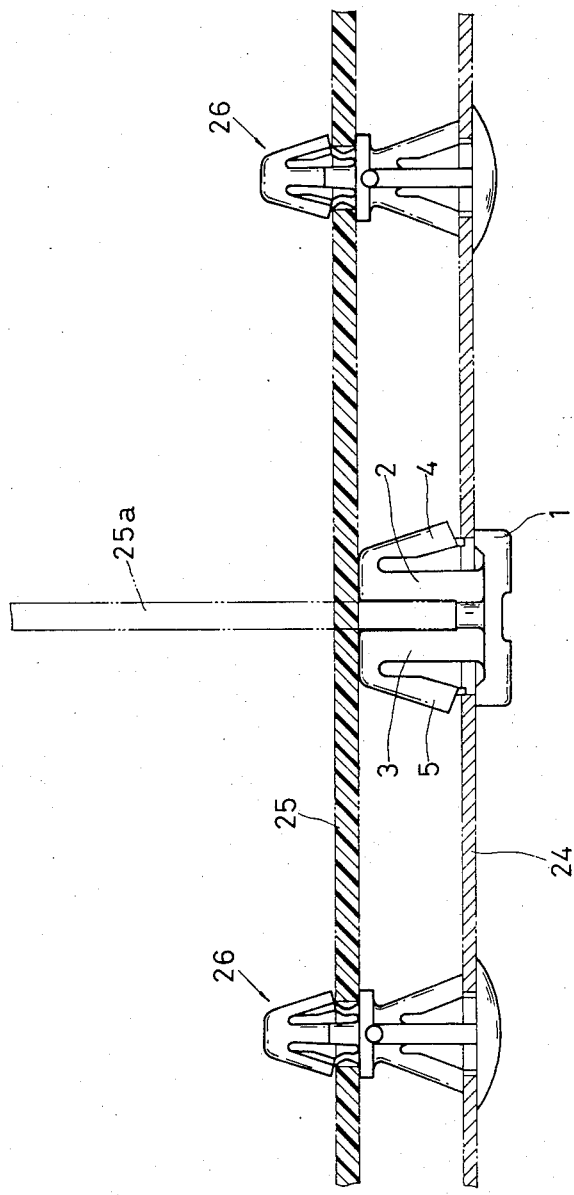

PLATE HOLDER

BACKGROUND OF THE INVENTION (1) Field of Art

The present invention relates to a plate holder adapted to be attached to chassis of electronic devices, printed circuit boards and other mounting panels (together referred to hereinafter as "base plate") and hold a plate such as, a printed circuit board relative to the base plate.

(2) Prior Art

A plate holder adapted to be fitted in a mounting hole formed in a base plate and hold a printed circuit board or the like relative to the base plate has been filed as Japanese Utility Model Application No. 49445/83 by the applicant in the present case. In the plate holder of this prior application, two holding pieces are erected on a base in spaced relation to each other, while a columnar portion is formed projectingly on the lower surface of the base and elastic non-return pieces are formed on both sides of the columnar portion. The plate holder thus constructed is fitted in a mounting hole formed in a chassis, a panel or the like as a base plate through the elastic non-return pieces and a printed circuit board or the like is inserted between the holding pieces and thereby held in place.

However, such plate holder is not employable where there is not much space below a mounting panel or the like, because the elastic non-return pieces and the columnar portion are projecting at the lower portion of the plate holder. Moreover, in the case where a printed circuit board is to be inserted between the holding pieces while it is allowed to slide, using the plate holder as a guide rail, the printed circuit board must be held in a floating state when inserted between the holding pieces because the sliding surface projects from the panel surface by the thickness of the base. Thus, the working efficiency is poor. Further, where a printed circuit board is held in an upright state with its lower end alone inserted between the holding pieces, if its upper portion is now in a free state, a force which forces open the holding pieces will act on the holding pieces and cause them to open easily, thus resulting in that the printed circuit board is easily disengaged from the holding pieces.

SUMMARY OF THE INVENTION

It is an object of the present invention to provide a plate holder which is employable even where there is not much space below a plate to be held.

It is another object of the present invention to provide a plate holder capable of being easily used also as a guide plate and holding a printed circuit board or the like firmly in an upright state.

It is a further object of the present invention to provide a plate holder which disperses a bending moment trying to force open the holder and is thereby prevented from being expanded upon tilting of a held plate in contact with a man or a tool and exertion of such bending moment on the holder when only the lower portion of the plate is inserted in the holder and inspection is performed in a free state of the upper portion of the plate.

In order to achieve the above-mentioned objects, the present invention resides in a plate holder adapted to be fitted in a mounting hole formed in a base plate, in which two holding plates are erected on a base perpendicularly in spaced relation to each other, and outside the holding plates are formed elastic non-return pieces adapted to be elastically retained in the mounting hole of the base plate. The non-return pieces prevent withdrawal of the plate holder from the mounting hole, unless the non-return pieces are squeezed together to prevent withdrawal. With this construction, the plate holder can be attached to the base plate without projection of its lower portion on the base plate, and a plate such as a printed circuit board inserted between the holding plates is supported also by the elastic non-return pieces, thus improving the plate holding performance.

BRIEF DESCRIPTION OF THE DRAWINGS

FIGS. 7 and 8 illustrate modes of use.

DESCRIPTION OF A PREFERRED EMBODIMENT

Figure 1:
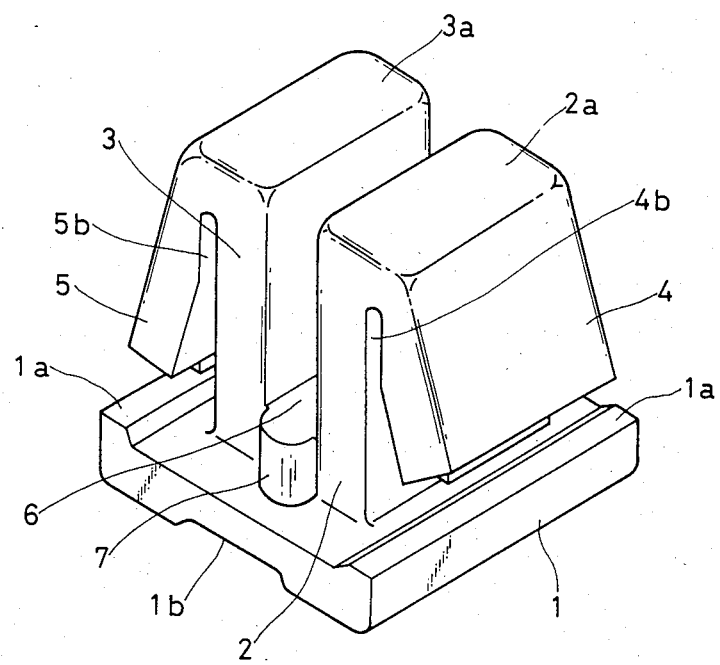
FIG. 1 is a perspective view of a plate holder embodying the invention.

As shown in FIGS. 1, 2, 3 and 4 which are a perspective view of a plate holder according to an embodiment of the present invention, a front view thereof, a side view thereof and a plan view thereof, respectively, a flat base 1 is formed which constitutes a lower portion of the plate holder and which has a recess 1b. On the base 1 are erected two holding plates 2 and 3 perpendicularly in substantially parallel spaced relation to each other to form a first plate holding space therebetween. Further, on both side edges of the upper surface of the base 1 there are formed slightly upwardly projecting edge portions 1a for holding elasticity at the time of mounting of the holder to a first plate. The two holding plates 2 and 3 are held at a predetermined spacing which permits insertion and holding therein of a second plate such as a printed circuit board. Outside the holding plates 2 and 3 are formed elastic non-return pieces 4 and 5 integrally and contiguously, extending from upper end portions of the holding plates 2 and 3 downwardly toward the base 1 while forming clearances 4b and 5b between inner surfaces of the elastic non-return pieces 4 and 5 and the holding plates 2 and 3, respectively. Further, plane surfaces 2a and 3a are formed in parallel with the base 1.

Figure 2:
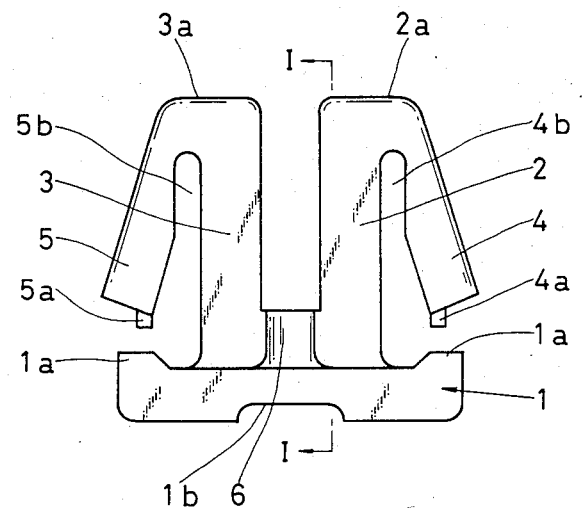
FIG. 2 is a front view thereof.
Figure 3:
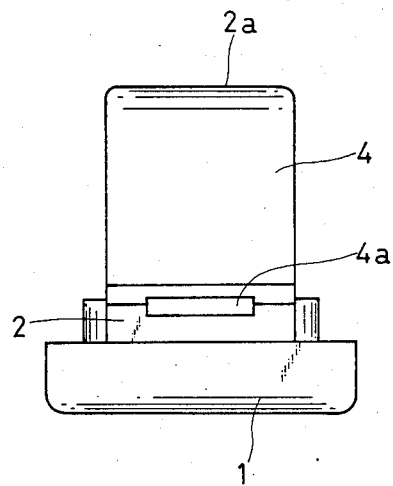
FIG. 3 is a right side view thereof.
Figure 4:
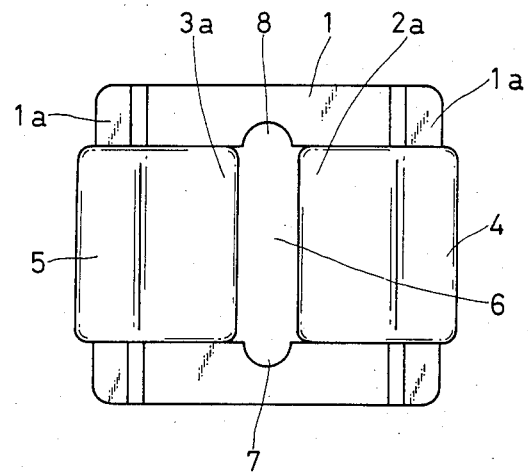
FIG. 4 is a plan view thereof.
Figure 5:
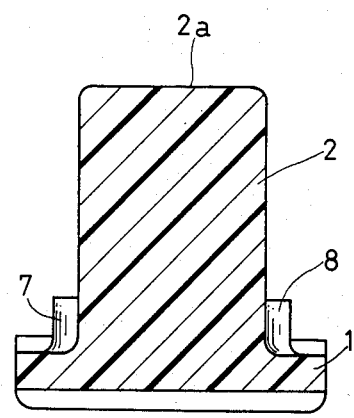
FIG. 5 is a sectional view taken on line I—I of FIG. 2.

The elastic non-return pieces 4 and 5 have a structure which permits an elastic deformation, with lower end portions thereof being inclined away from one another open form, as shown in FIG. 2. Projection 4a and 5a are formed at each lower end to engage with the edge portion of the mounting aperture of the first or base plate when attached. The space between the lower end portions of the elastic non-return pieces 4 and 5 and the projecting edge portions 1a of the base 1 is set at a value almost equal to the thickness of the base plate to which the plate holder is attached. The bottom portion between the two holding plates 2 and 3 is formed as a stepped portion 6 higher than the upper surface of the base 1 so as to be substantially flush with the lower end portions of the elastic non-return pieces 4 and 5. At both side portions of the stepped portion 6 are formed semicircular protuberances 7 and 8 for effective positioning relative to the mounting hole of the base plate.

Figure 6:
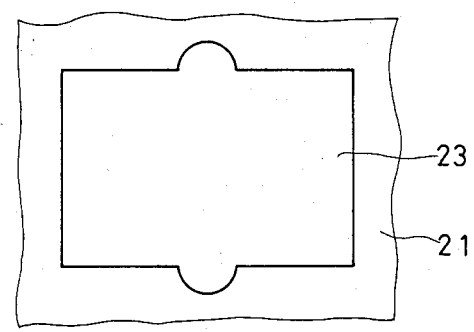
FIG. 6 is a plan view of a mounting hole formed in a base plate.

The plate holder of such a structure is integrally formed of a synthetic resin material such as nylon. It is fitted in a rectangular mounting hole 22 formed in a base plate 21 as a shown in FIG. 6 and is used in such modes as shown in FIGS. 7 and 8.

Figure 7:
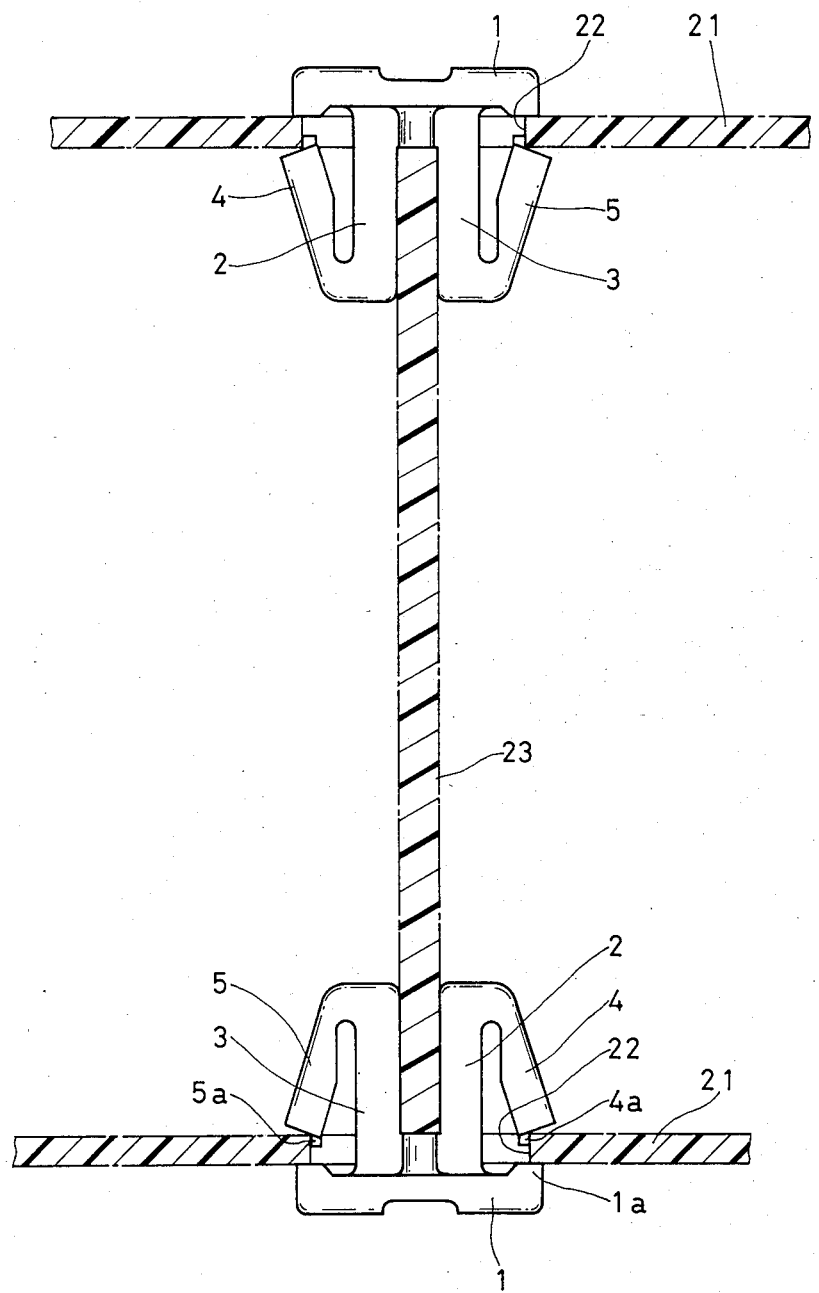

FIG. 7 shows a mode of use in which a plate 23 is held perpendicularly between base plates 21 which are disposed horizontally up and down. Each plate holder is inserted into the rectangular mounting hole 22 of the base plate 21. In this case, it is inserted from above to the upper base plate 21 in the figure and from below to the lower base plate 21. The base 1 is pushed in up to the position in which the base plate 21 is held between the lower ends of the elastic non-return pieces 4, 5 and the projecting edge portion 1a of the base 1. When the elastic non-return pieces 4 and 5 which have undergone elastic deformations in the mounting hole 22 are projected completely to the side opposite to the insertion side of the mounting hole, they open by virtue of elastic return, allowing the projections 4a and 5a at their lower ends to come into elastic engagement with a marginal portion of the mounting hole 22, whereby the base plate 21 is held between the base 1 and the lower end portions of the elastic non-return pieces 4 and 5, and thus the plate holder is fitted in the mounting hole 22 of the base plate 21. This fitted state is maintained firmly by the elastic action of the elastic non-return pieces 4 and 5. As shown in FIG. 7, the plate holder is mounted in opposed upper and lower positions and in this state the lower end portion of the plate 23 is inserted between the holding plates 2 and 3 of the lower plate holder, while the upper end portion thereof is inserted between the holding plates 2 and 3 of the upper plate holder, whereby the plate 23 is held perpendicularly to the base plates 21. In this case, each inserting end portion of the plate 23 is at the same level as the corresponding base plate 21, and therefore the plate 23 can be easily inserted and held between the plate holders by inserting it while allowing it to slide laterally. Further, the gripping force of each plate holder for the plate 23 becomes the sum of the elastic force of the holding plates 2 and 3 and that of the elastic non-return pieces 4 and 5, and thus it becomes larger in comparison with the provision of the holding plates 2 and 3 alone.

FIG. 8 shows a mode of use in which a printed circuit board 25 is held above a chassis 24 as a base plate. The printed circuit board 25 is fixed above the chassis 24 horizontally in spaced relation using another base plate fixing means 26. More specifically, the plate holder is fitted on the chassis 24 in the same manner as above in an intermediate position between the base plate connecting means 26 disposed on both sides, and the fore ends of the holding plates 2 and 3 of the plate holder are brought into abutment on the lower surface of the printed circuit board 25. Thus, the plate holder is used as an intermediate spacer. In such a state of use, the plate holder supports the printed circuit board 25 in an intermediate position and prevents deflection of the board. In this case, since the base 1 of the plate holder is formed as thin as the base plate connecting means 26, there is no fear of its projecting below the chassis 24 and contacting other parts, etc.

For maintenance and inspection or repair, the printed circuit board 25 thus held above the chassis 24 can be disengaged from the base plate connecting means 26 and inserted perpendicularly between the holding plates 2 and 3 of the plate holder, thereby facilitating the required operation. During inspection, only the lower end portion of a printed circuit board 25a is held vertically by the plate holder, and the upper end portion thereof is kept free. In this case, even in the event a tilting force is exerted on the printed circuit board 25a and a bending moment acting to force open the holding plates 2 and 3 of the plate holder is applied to those plates by mistake, such force is dispersed to the elastic non-return pieces 4 and 5, thus preventing the holding plates 2 and 3 from opening and causing deterioration of the grippability.

What is claimed is:

1. A plate holder for securing a first plate to a second plate, said plate holder comprising:
    a plate like base having means for engaging one surface of said first plate;
    first and second substantially parallel resilient holding plates fittable through an aperture in said first plate, each said holding plate having one end connected to one surface of said base and freely extending from said base without mutual contact to define a second plate holding space therebetween;
    elastic non-return pieces each having a first end connected to a distal end of one said holding plate and extending toward said base to a second end adjacent said base; and
    means on said second end of each said non-return piece for engaging an edge defined between another surface of said first plate and said aperture when said holding plates are fitted through said first plate;
    whereby the engagement of said means for engagement with said first plate when said second plate is in plate holding space resiliently presses said holding plates together to hold said second plate in said second plate holding space.

2. A plate holder according to claim 1 further comprising:
    clearances formed between said holding plates and said elastic non-return pieces toward the base; and
    a stepped portion which constitutes a bottom of said plate holding space said stepped portion being raised from said base and parallel with said base.

3. A plate holder according to claim 1, wherein said plate holder is integrally formed of a synthetic resin.

4. A plate holder according to claim 2, wherein the stepped portion has semicircular protuberances which are adapted to engage recessed portions of said aperture to serve as a guide when mounting to said first plate.

* * * * *